(12) United States Patent
Huppmann et al.

(10) Patent No.: US 10,475,955 B2
(45) Date of Patent: Nov. 12, 2019

(54) METHOD FOR PRODUCING A PLURALITY OF COMPONENTS, AND COMPONENT

(71) Applicant: OSRAM Opto Semiconductors GmbH, Regensburg (DE)

(72) Inventors: Sophia Huppmann, Geldersheim (DE); Simeon Katz, Regensburg (DE); Marcus Zenger, Hausen (DE); Dominik Scholz, Bad Abbach (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/779,251

(22) PCT Filed: Nov. 30, 2016

(86) PCT No.: PCT/EP2016/079301
§ 371 (c)(1),
(2) Date: May 25, 2018

(87) PCT Pub. No.: WO2017/093327
PCT Pub. Date: Jun. 8, 2017

(65) Prior Publication Data
US 2018/0358509 A1    Dec. 13, 2018

(30) Foreign Application Priority Data
Dec. 3, 2015    (DE) ........................ 10 2015 121 056

(51) Int. Cl.
*H01L 21/30*    (2006.01)
*H01L 21/46*    (2006.01)
(Continued)

(52) U.S. Cl.
CPC .......... *H01L 33/0079* (2013.01); *H01L 33/22* (2013.01); *H01L 33/382* (2013.01); *H01L 33/62* (2013.01); *H01L 2933/0033* (2013.01)

(58) Field of Classification Search
CPC ... H01L 33/0079; H01L 33/22; H01L 33/382; H01L 33/62
(Continued)

(56) References Cited

U.S. PATENT DOCUMENTS

| | | |
|---|---|---|
| 7,329,587 B2 | 2/2008 | Bruederl et al. |
| 9,613,849 B2 | 4/2017 | Konishi et al. |

(Continued)

FOREIGN PATENT DOCUMENTS

| | | |
|---|---|---|
| DE | 102013110853 A1 | 4/2015 |
| DE | 102014100773 A1 | 7/2015 |

(Continued)

OTHER PUBLICATIONS

Kang, Y. et al., "Water-fused p-i-n InGaAs/Si photodiode with photogain," Applied Physics Letters, vol. 79, No. 7, Aug. 12, 2001, 3 pages.

(Continued)

*Primary Examiner* — David S Blum
(74) *Attorney, Agent, or Firm* — Slater Matsil, LLP (57) ABSTRACT

A method for producing a plurality of components and a component are disclosed. In an embodiment the method includes providing a carrier composite comprising a base body and a planar connecting surface, providing a wafer composite comprising a semiconductor body composite and a planar contact surface, connecting the wafer composite to the carrier composite thereby forming a joint composite so that the planar contact surface and the planar connecting surface are joined forming a joint boundary surface. The method further includes reducing inner mechanical stress in the joint composite so that a material of the carrier composite is removed in places, wherein the joint composite is thermally treated in order to form a permanent mechanically-stable connection between the wafer composite and the (Continued)

carrier composite, and wherein reducing inner stress is effected prior to the thermal treatment.

19 Claims, 6 Drawing Sheets

(51) Int. Cl.
   *H01L 23/552* (2006.01)
   *H01L 33/00* (2010.01)
   *H01L 33/22* (2010.01)
   *H01L 33/38* (2010.01)
   *H01L 33/62* (2010.01)

(58) Field of Classification Search
   USPC .......................................... 438/458; 257/659
   See application file for complete search history.

(56) References Cited

U.S. PATENT DOCUMENTS

| | | |
|---|---|---|
| 9,721,940 B2 | 8/2017 | Plössl et al. |
| 2014/0141552 A1 | 5/2014 | Zou et al. |
| 2014/0220716 A1 | 8/2014 | Steigerwald et al. |
| 2016/0218097 A1 | 7/2016 | Plössl et al. |
| 2016/0218240 A1 | 7/2016 | Bouvier et al. |
| 2016/0336307 A1 | 11/2016 | Herrmann et al. |

FOREIGN PATENT DOCUMENTS

| | | |
|---|---|---|
| FR | 3011383 A1 | 4/2015 |
| JP | 2001057441 A | 2/2001 |
| TW | I240434 B | 9/2005 |
| TW | 201314739 A | 4/2013 |
| TW | 201440116 A | 10/2014 |
| WO | 2013011415 A1 | 1/2013 |
| WO | 2013189949 A1 | 12/2013 |
| WO | 2015049079 A1 | 4/2015 |
| WO | 2015110359 A1 | 7/2015 |

OTHER PUBLICATIONS

Tong, Q.Y. et al., "Semiconductor wafer bonding: recent developments," Materials Chemistry and Physics, 37, 1994, 27 pages.

METHOD FOR PRODUCING A PLURALITY OF COMPONENTS, AND COMPONENT

This patent application is a national phase filing under section 371 of PCT/EP2016/079301, filed Nov. 30, 2016, which claims the priority of German patent application 10 2015 121 056.8, filed Dec. 3, 2015, each of which is incorporated herein by reference in its entirety.

TECHNICAL FIELD

A method for producing a plurality of components and a component are provided.

BACKGROUND

In mass production of semiconductor components, a wafer is often mechanically connected to a carrier on wafer level and, in a subsequent method step, singulated into a plurality of semiconductor components. In particular in a direct bonding method, due to large temperature fluctuations during production, even small defects on a connecting surface between the semiconductor wafer and the carrier may lead to large-area failures of semiconductor components.

SUMMARY OF THE INVENTION

Embodiments of the invention provide a reliable and cost-effective method for producing a plurality of components. Further embodiments of the invention provide a component having high mechanical stability.

According at least one embodiment of a method for producing a plurality of components, a carrier composite is provided. The carrier composite comprises a base body, which in particular is electrically-insulating or semi-conductive. Here, the base body may account for at least 80%, for example, at least 90% or at least 95% of the volume and/or of the weight of the carrier composite. The base body comprises a semiconductor material, such as silicon, for example, or consists of a semiconductor material such as silicon.

The carrier composite may have a planar connecting surface. In particular, the planar connecting surface delimits the carrier composite in a vertical direction and is thus an exposed surface of the carrier composite, for example. The planar connecting surface is preferably configured as a contiguous surface of the carrier composite, which extends in particular in lateral directions over the entire main extension plane of the carrier composite. In particular, the planar connecting surface is free of abrupt height changes such as edges, for example.

A planar surface refers to a surface which in particular is configured to be microscopically flat. Such a planar surface has a local vertical roughening, which in particular is smaller than 5 nm, smaller than 3 nm, preferably smaller than 1 nm or smaller than 0.5 nm. A vertical direction refers to a direction, which in particular is directed perpendicular to the main extension surface of the carrier composite or of a carrier of a component produced from the carrier composite. A lateral direction refers to a direction running approximately parallel to the main extension surface of the carrier composite. In particular, the vertical direction and the lateral direction are oriented transverse, for example, approximately perpendicular, to one another.

According to at least one embodiment variant of the method, the carrier composite comprises an insulation layer, wherein the planar connecting surface of the carrier composite is formed by a surface of the insulation layer. The insulation layer can directly or indirectly be applied to the base body, for example, by means of a coating method. Subsequently, the insulation layer can be polished, for example, by means of a chemical-mechanical planarization method, for forming the planar connecting surface.

As an alternative, it is possible for the insulation layer to be configured as a hybrid layer. In this case, the insulation layer may comprise one or a plurality of electrically-insulating sub-regions or one or a plurality of electrically-conductive sub-regions. Instead of an exclusively-insulating layer, the carrier compound may thus comprise a connecting layer configured as a hybrid layer. The planar connecting surface formed by a surface of the hybrid layer or the connecting layer, respectively, can in some areas comprise electrically-conductive sub-regions and in some areas comprise electrically-insulating sub-regions. The electrically-insulating sub-regions of the hybrid layer can be formed of an electrically-insulating material. The electrically-conductive sub-regions of the hybrid layer can be formed of an electrically-conductive material, such as a metal. The hybrid layer may have a composition that changes over the lateral extension direction of the hybrid layer. The respective electrically-conductive or electrically-insulating sub-region may extend along the vertical direction through the entire hybrid layer.

According to at least one embodiment of the method, a wafer composite is provided. The wafer composite may contain a semiconductor body composite, which comprises a plurality of semiconductor layers, for example. In addition, the wafer composite may comprise a substrate, such as a growth substrate, on which the semiconductor body composite is arranged. In particular, the semiconductor body composite is applied to the growth substrate in layers, in particular deposited epitaxially. The wafer composite may comprise a contact structure configured to electrical contacting of the semiconductor body composite. For example, the semiconductor body composite is arranged in the vertical direction between the contact structure and the substrate.

According to at least one embodiment of the method, the wafer composite comprises a planar contact surface. The planar contact surface is in particular formed by an exposed surface of the wafer composite facing way from the substrate. Here, the wafer composite may comprise a planarization layer comprising an exposed surface as a planar contact surface of the wafer composite. The planarization layer can be an electrically-insulating layer, such as an electrically-insulating oxide layer. The planarization layer can be arranged on the semiconductor body composite in such a way that the planarization layer covers the contact structure. After application of the planarization layer onto the wafer composite, this layer may have a layer thickness of several μm, for example, between including 1.5 μm and 10 μm in some areas. In order to form the planar contact surface, a surface of the planarization layer is polished by means of chemical-mechanical planarization to a roughness of less than several nm, for example, less than 5 nm, for example, less than 3 nm, preferably less than 1 nm or less than 0.5 nm.

According to at least one embodiment of the method, the planarization layer is formed as a hybrid layer. Such a hybrid layer may comprise one or a plurality of electrically-conductive sub-regions and one or a plurality of electrically-insulating sub-regions. The planarization layer may thus comprise a surface, which is configured to be electrically-conductive in some areas and configured to be electrically-insulating in some areas. For example, the electrically-conductive sub-regions of the planarization layer are formed by contact layers of the contact structure, wherein the contact layers are configured in particular for the electrical contacting of the semiconductor body composite and the semiconductor body thereof, respectively. In this case, surfaces of contact layers may form sub-regions of the planar contact surface. The electrically-insulating sub-regions of the planarization layer can be formed of an electrically-insulating material. The surfaces of these electrically-insulating sub-regions can form further sub-regions of the planar contact surface. The hybrid layer may have a composition that changes over the lateral extension direction thereof. The respective electrically-conductive or electrically-insulating sub-region may extend along the vertical direction through the entire hybrid layer.

According to at least one embodiment of the method, the wafer composite and the carrier composite are preliminarily connected to one another (pre-bond) in order to form a composite, in that the planar contact surface and the planar connecting surface are joined in order to form a joint boundary surface. The joint boundary surface thus separates the wafer composite from the carrier composite and vice versa. In particular, the joint boundary surface is formed, at least in places or completely, by the planar contact surface and/or the planar connecting surface. Preferably, the composite of the carrier composite and of the wafer composite is formed by means of a direct bonding method. The joint boundary surface is free of a connecting element such as a bonding agent. The joint boundary surface can thus be an overlapping surface between the connecting surface and the contact surface developing upon joining.

In a direct bonding method, in particular hydrophilic and hydrophobic surfaces are brought into physical contact. The basis of the mechanical connection is mainly or exclusively provided by hydrogen bridges and/or Van-der-Waals-interactions in direct vicinity of the joint boundary surface. For generating covalent bonds between atoms and molecules on the surfaces being in physical contact, a thermal treatment for achieving high bond stability is subsequently used.

Due to the planar configuration of the contact surface and of the connecting surface, the carrier composite and the wafer composite may be mechanically-connected by means of a direct bonding method. In this bonding technique, in particular a connecting material, such as an adhesive or a solder material, as well as external pressure action, can be dispensed with. Apart from that, it is also conceivable that the carrier composite and the wafer composite can be connected to one another by means of an alternative method, for example, with a connecting material.

According to at least one embodiment of the method, the insulation layer and the planarization layer are each designed as a hybrid layer. In this case, the insulation layer can generally be referred to as a connecting layer. The overlapping surface between the connecting surface and the contact surface arising upon joining may thus comprise electrically-insulating sub-regions and electrically-conductive sub-regions. In particular, the electrically-conductive and/or electrically-insulating sub-regions of the hybrid layer pair, i.e., of the planarization layer and the connecting layer, respectively, adjoin one another directly. In particular, the electrically-conductive sub-regions of the planarization layer and of the connecting layer are in direct electrical contact with one another on the joint boundary surface directly after connecting the wafer composite with the carrier composite. The electrically-insulating sub-regions of the respective hybrid layer can be formed of an oxide, such as silicon oxide, silicon dioxide or aluminum oxide, such as $Al_2O_3$. The electrically-conductive sub-regions of the respective hybrid layer are, for example, formed of a metal or by means of a transmissive and electrically-conductive oxide, in particular a metal oxide such as ITO, AlZnO, ZnO and GaInO.

According to at least one embodiment of the method, inner mechanical stress, for example, shear stress, are reduced inside the composite of the carrier composite and the wafer composite, whereby the joint boundary surface can be at least locally enlarged and/or a possible defect surface is reduced. The inner mechanical stress in the composite can be reduced by removing material of the composite in some areas, for example. The carrier composite can be thinned after performing the preliminary or permanent mechanically-stable connection, for example. Here, the material of the carrier composite can be removed in such a way that the carrier composite has a reduced vertical layer thickness. In other words, the total thickness of the carrier composite can be reduced, for example, by removing material in a targeted manner. It is also possible that the wafer composite is thinned in order to reduce the inner mechanical stress in the composite. In order to reduce inner stress, it is also possible to form recesses in the composite, for example, in the carrier composite and/or the wafer composite.

It has been found (Q.-Y-Tong, U. Gösele, Mater. Chem. Phys. 37 (1994) 101) that a radius R of a defect surface, on which the contact surface does not directly adjoin the connecting surface due to imperfections, for example, from roughening or impurities by foreign particles, can be indicated as follows:

$$R = \left[\frac{1.3\ E'_T T^3 E'_D D^3}{\gamma(E'_T T^3 + E'_D D^3)}\right]^{1/4} H^{1/2}$$

with E'=E/(1−ν), Poisson number ν, Young's modulus E, layer thickness of the wafer composite D, layer thickness of the carrier composite T, height of the imperfection H and surface energy of the bonded composite partners γ. $E_T$ and $E_D$ are the Young's modulus of the carrier composite respectively of the wafer composite. In the case of doubt, $E_T$ is the average Young's modulus of the carrier composite and $E_D$ is the average Young's modulus of the wafer composite.

Thus, the radius of the defect surface is proportional to the height of the imperfection, for example, the roughness of the contact surface and/or of the connecting surface and/or of the foreign particle. Furthermore, the radius of the defect surface depends on the layer thicknesses of the wafer composite and carrier composite. Reducing the layer thickness can lead to a reduced size of the defect surface. Removal of material, for example, by forming recesses in the composite, leads to a spatial separation of the defect, and thus to a reduced size of the defect surface. According to at least one embodiment of the method, the composite is thermally treated, for example, for forming a permanent mechanical connection between the wafer composite and the carrier composite. In the thermal treatment, for example, at a temperature between approximately 100° C. and 1,100° C., preferably between 100° C. and 350° C., covalent bonds are formed between the carrier composite and the wafer composite, whereby a particularly stable mechanical connection is formed between the carrier composite and the wafer composite.

In at least one method for producing a plurality of components, a carrier composite is provided, which contains a base body and comprises a planar connecting surface.

Furthermore, a wafer composite is provided, which contains a semiconductor body composite and comprises a planar contact surface. In order to form a composite, the carrier composite is connected to the wafer composite, in that the planar contact surface and the planar connecting surface are joined in order to form a joint boundary surface. On the joint boundary surface, the connecting surface and the contact surface are in particular in direct mechanical contact. In a subsequent method step, inner mechanical stress within the composite are reduced in that the material of the carrier composite is removed in places. In a subsequent method step, the composite is singulated into a plurality of components. Optionally, a permanent and particularly mechanically-stable connection can be formed between the wafer composite and the carrier composite by a thermal treatment of a composite.

By reducing inner mechanical stress after connection and prior to complete singulation, for example, after a preliminary connection (pre-bond) and prior to the thermal treatment of the composite made of the carrier composite and the wafer composite, possible defect surfaces are reduced in size and made smaller, respectively, whereby potential large-area failures of components to be produced can be avoided. By gradual reduction of mechanical stress in the composite, losses in components can be minimized, since in particular only components directly affected by foreign particles cannot be bonded. By the reduction of the layer thickness only after connecting the carrier composite with the wafer composite, for example, when attaching the carrier composite on the wafer composite, the carrier composite may have a particularly mechanically stable design, wherein components having a particularly low construction height can be achieved at the same time by means of this method, in particular due to the subsequent reduction of the total layer thickness of the composite.

According to at least one embodiment of the method, the composite of the carrier composite and the wafer composite is formed by means of a direct bonding method. In a direct bonding method, the planar connecting surface and the planar contact surface are joined at a suitable pressure and suitable temperature for forming the joint boundary surface, wherein the carrier composite and the wafer composite are initially, mainly or exclusively, mechanically connected to one other on the planar surfaces due to Van-der-Waals-interactions or hydrogen bridges between the atoms. In particular, the joint boundary surface comprises directly adjoining regions of the connecting surface and the contact surface. Joining the wafer composite and the carrier composite can initially be effected under normal conditions, for example, at room temperature (pre-bond), wherein the composite is thermally-treated in a subsequent method step, for example, for producing covalent bonds. The thermal treatment is preferably effected after the reduction of the inner mechanical stress and in particular together with the substrate, for example, with the growth substrate, on which the semiconductor body composite of the wafer composite is arranged. In a later method step, the growth substrate can be removed from the wafer composite and the semiconductor body composite, respectively, preferably after the optional thermal treatment.

According to at least one embodiment of the method, the reduction of inner stress is effected after the preliminary connection and prior to the thermal treatment. The defect surface can thus be minimized before the mechanical connection between the wafer composite and the carrier composite is additionally reinforced by the thermal treatment.

According to at least one variant of the method, the joint boundary surface is at least locally enlarged by the reduction of inner mechanical stress in the composite. Possible defect surfaces or defect regions, which are formed by means of directly adjoining and overlapping regions of the connecting surface and the contact surface, can be reduced or made smaller by reducing inner mechanical stress. Reducing or minimizing the size of possible defect surfaces leads to an at least local or global enlargement of the joint boundary surface. Here, the defect surfaces can be regions of the connecting surface and/or contact surface, which cannot directly adjoin one another due to imperfections and have a bent or curved shape. If a defect surface is present in the composite of wafer composite and carrier composite, a defect region having the vertical height of the imperfection, for example, of the roughness or foreign particle, and the lateral radius of the defect surface can be enclosed by the composite on all sides. Such a defect region can be reduced in size by a reduced thickness and/or by recesses in the carrier composite.

According to at least one embodiment of the method, recesses are formed through the base body in order to reduce inner mechanical stress within the composite. The joint boundary surface can possibly be globally reduced in size by the removal of material, if the recesses extend through the joint boundary surface and a sum of the lateral cross-sections thereof is greater than an area by which the defect surface is decreased due to the formation of the recesses. Outside the recesses, the joint boundary surface can be locally enlarged at least on the defect region or the defect regions, respectively. Here, the recesses can be openings for forming electrical through-connections through the base body or separation trenches for the division of the composite into a plurality of components.

According to at least one embodiment of the method, the insulation layer of the carrier composite is an oxide layer. For example, the insulation layer is a silicon oxide layer, for example, a layer of $SiO_2$. The base body is preferably formed of silicon. A silicon oxide layer can particularly easily be formed on the base body, for example, by deposition of silicon oxide such as $SiO_2$ on the base body. If the base body is made of silicon, this body can be oxidized in order to form the insulation layer as a layer of natural silicon oxide. It is also possible for the base body to be formed of an electrically-insulating and/or particularly semiconducting material other than silicon. It is also possible that the insulation layer is formed of an electrically-insulating material other than silicon oxide.

According to at least one embodiment of the method, the wafer composite is provided with a planarization layer and contact layers on the semiconductor body composite. The contact layers are in particular configured for the electrical contacting of the semiconductor body composite. The contact layers can be enclosed by the planarization layers at least in lateral directions. The planar contact surface is formed by a surface of the planarization layer at least in places. It is possible that the planarization layer completely covers the contact layers in a top view on the semiconductor body composite. The planar contact surface can therefore exclusively be formed by an exposed surface of the planarization layer.

It is conceivable for the planarization layer to be subsequently structured after the attachment onto the contact layers, for example, by a chemical and/or mechanical process so that the contact layers are exposed in places. In this case, the contact surface can be formed in some areas by surfaces of the contact layers and can be formed in some areas by surfaces of the planarization layer. The contact surface is preferably polished to a roughness of less than 5 nm, in particular less than 3 nm, preferably less than 1 nm or less than 0.5 nm. Here, the planarization layer can be formed of silicon oxide, such as silicon dioxide, for example. If both the contact surface and the connecting surface are at least in places or completely formed of surfaces of silicon dioxide layers, such as $SiO_2$ layers, for example, fixing the wafer composite to the carrier composite can be performed by a direct bonding method.

According to at least one embodiment of the method, the contact layers are completely covered by the carrier composite after connection. Prior to the optional thermal treatment, openings can be formed through the carrier composite for exposing the contact layers. In a subsequent method step, the openings can be filled with an electrically-conductive material, for example, a metal such as copper, so that the contact layers can be electrically contacted from the rear side of the carrier composite facing away from the wafer composite, for example.

According to at least one embodiment of the method, a plurality of separation trenches are produced through the base body after connecting the wafer composite to the carrier composite. The composite of carrier composite and wafer composite is in particular singulated into a plurality of components, in particular after an optional thermal treatment, in such a way that the components comprise in each case a semiconductor body as a part of the semiconductor body composite and a carrier as a part of the carrier composite. By forming separating trenches, i.e., by the removal of material, inner mechanical stress within the composite are gradually reduced, whereby the joint boundary surface is enlarged and possible defect surfaces are reduced. The separating trenches can be designed such that the components to be produced are each enclosed laterally by the separating trenches. The separating trenches may extend at least in places along the vertical direction through the carrier composite into the semiconductor body composite or through this semiconductor body composite.

According to at least one embodiment of the method, the wafer composite is provided with a growth substrate, with the semiconductor body composite being arranged on the growth substrate. The growth substrate is removed from the semiconductor body composite and the wafer composite, respectively, preferably even after the thermal treatment.

In at least one embodiment of a component, the component comprises a carrier and a main body arranged on the carrier. In particular, the component is an optoelectronic component, a light-emitting diode, for example. In particular, the main body comprises a semiconductor body with an active layer configured to generate radiation or to detect radiation. The main body contains an electrically-insulating planarization layer with a planar contact surface that faces the carrier. The carrier may contain a base body and an insulation layer which is arranged on the base body and faces the main body and has a planar connecting surface. The component comprises a particularly planar-designed boundary surface between the main body and the carrier, the planar boundary surface being formed by directly-adjoining regions of the planar connecting surface and the planar contact surface. The planar boundary surface is in particular free of a connecting material such as a solderable material or an adhesive. The insulation layer and the planarization layer can be formed of the same material. It is also possible for them to at least partially comprise different materials.

The method for producing a plurality of components described herein is particularly well suited for producing the component described herein. Features described in conjunction with the method can thus be used for the component and vice versa.

According to at least one embodiment of the component, the carrier comprises a rear side facing away from the connecting surface, which is formed by a surface of the base body and presents traces of mechanical processing, for example. The processing traces can be typical mechanical traces of a method for reducing the layer thickness of the carrier or the base body of the carrier.

According to at least one embodiment of the component, the main body comprises a contact structure configured for the electrical contacting of the semiconductor body composite, which is arranged between the semiconductor body and the carrier. The component can at least comprise an electrically-conductive through connection extending from the rear side of the carrier through the base body to the contact structure. The component may comprise a plurality of such through-connections. The through-connections can be assigned to different electric polarities of the component, so that the component can be electrically contacted exclusively via the rear side of the carrier, for example. The through-connection, or the plurality of through-connections, can be formed one-piece and protrude from the boundary surface between the carrier and the main body in a vertical direction. Thus, the through-connection and/or the plurality of through-connections can be produced in a single method step.

BRIEF DESCRIPTION OF THE DRAWINGS

Further advantages, preferred embodiments and further developments of the component as well as of the method result from the exemplary embodiments explained in conjunction with FIGS. 1A to 3B. The Figures show in.

Identical, like or equivalent elements are indicated with the same reference numerals in the figures. The figures are schematic illustrations and thus not necessarily true to scale, respectively. Comparatively small elements and particularly layer thicknesses, for example, at step-transitions of the layers, can rather be illustrated exaggeratedly large for the purpose of better clarification.

DETAILED DESCRIPTION OF ILLUSTRATIVE EMBODIMENTS

Figure 1A:
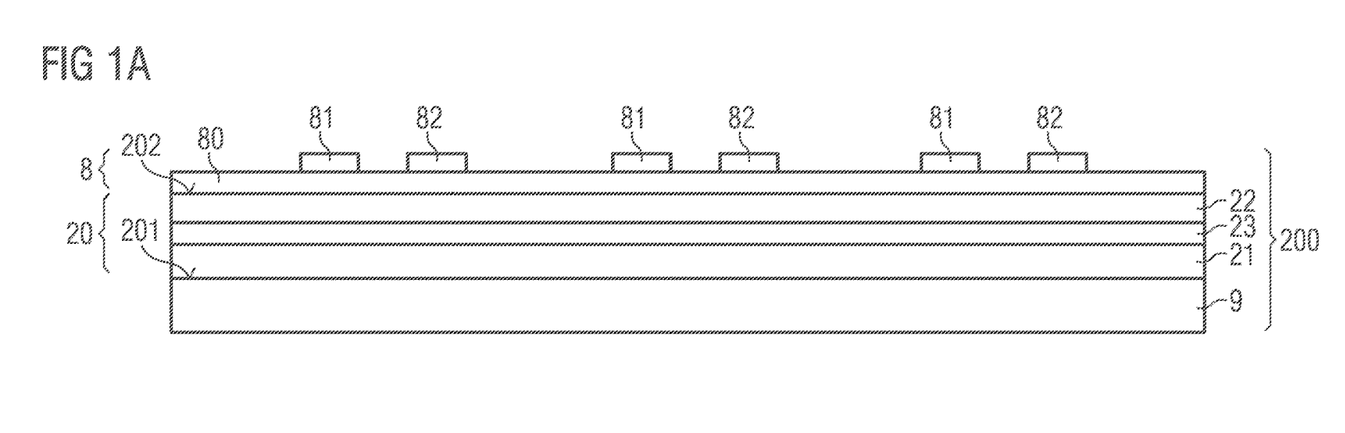
FIGS. 1A to 1H show schematic sectional views of different method stages of an exemplary embodiment for producing a plurality of components.

FIG. 1A illustrates a wafer composite 200. The wafer composite 200 comprises a semiconductor body composite 20 arranged on a substrate 9. In particular, the substrate 9 is a growth substrate such as a sapphire substrate. The semiconductor body composite 20 can be deposited onto the substrate 9 in layers by means of an epitaxial growth method.

The semiconductor body composite 20 comprises a first main surface 201 facing the substrate 9 and a second main surface 202 facing away from the substrate 9. In particular, the first main surface 201 is formed by a surface of a first semiconductor layer 21 of a first, for example, n-conducting charge carrier type and the second main surface 202 is formed by a second surface of a second semiconductor layer 22, for example, p-conducting charge carrier type. The semiconductor body composite 20 comprises an active layer 23 arranged between the first semiconductor layer 21 and the second semiconductor layer 22. In particular, the active layer is a p-n-junction zone. During operation of the component to be produced, the active layer 23 is preferably configured for detection or emission of electromagnetic radiation, for example, in the visible, ultraviolet or infrared spectral range.

The wafer composite 200 comprises a contact structure 8 configured for the electrical contacting of the semiconductor body composite 20. The semiconductor body 20 is arranged between the substrate 9 and the contact structure 8. The contact structure 8 comprises an electrically-conductive layer 80, for example, in the form of a mirror layer, and contact layers 81 and 82. In particular, the contact layers 81 and 82 are assigned different electric polarities of the component to be produced. A first contact layer 81 is provided for electrically contacting the first semiconductor layer 21 and a second contact layer 82 is provided for electrically contacting the second semiconductor layer 22, for example. The electrically-conductive layer 80 can be electrically connected to the first contact layer 81 or to the second contact layer 82. The contact structure 8 may comprise an insulating structure for electrical insulation of the first contact layer 81 to the second contact layer 82, which is not shown in FIG. 1A for reasons of clarity. The fact that the semiconductor body composite 20 can be structured into a plurality of semiconductor bodies 2, for example, is neither shown in FIG. 1A for reasons of clarity.

Figure 1B:
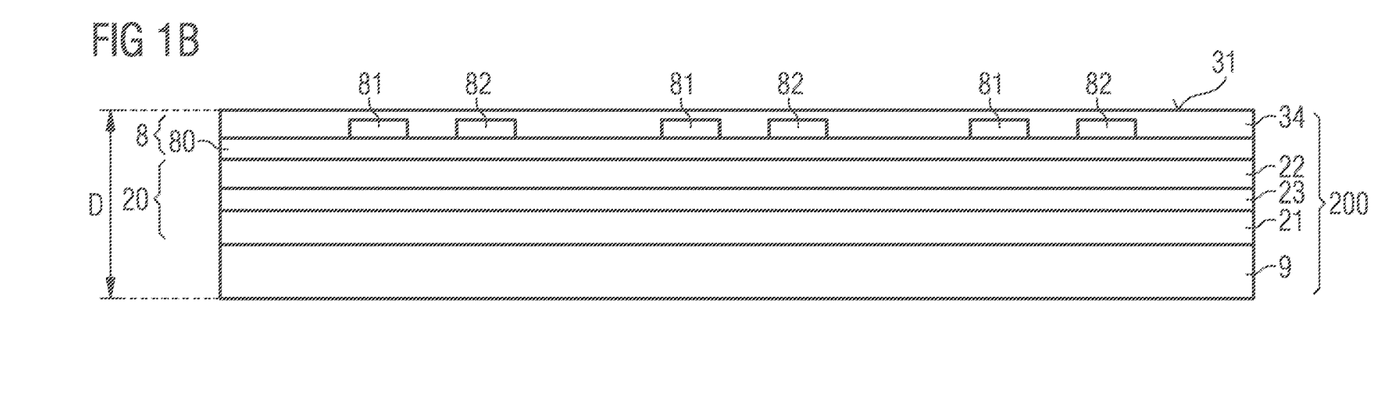

According to FIG. 1B, a planarization layer 34 is applied onto the semiconductor body composite 20 or the contact structure 8, respectively. Here, contact layers 81 and 82 are in particular covered completely. Here, the planarization layer 34 may have a vertical layer thickness between including 1 µm and 10 µm, for example, between 1 µm and 5 µm, for example, between including 3 µm and 5 µm. The planarization layer 34 is a $SiO_2$-layer, for example. In order to produce a planar contact surface 31, the planarization layer 34 is polished, for example, by a chemical and/or mechanical method to a roughness of less than 3 nm, preferably less than 1 nm or less than 0.5 nm. The planar contact surface 31 is preferably configured microscopically-flat in such a way that the contact surface 31 can serve as boundary surface for direct bonding of a wafer composite 200, for example.

According to FIG. 1B, the planar contact surface 31 is exclusively formed by the surface of the planarization layer 34. In contrast, it is also possible to polish the planarization layer 34 in such a way that the resulting planar contact surface 31 is formed by surfaces of the planarization layer 34 in places and is formed by surfaces of the contact layers 81 and/or 82 in places. According to FIG. 1B, the wafer composite 200 with the substrate 9, the semiconductor wafer body composite 20 and the contact structure 8 has a vertical layer thickness D.

Figure 1C:
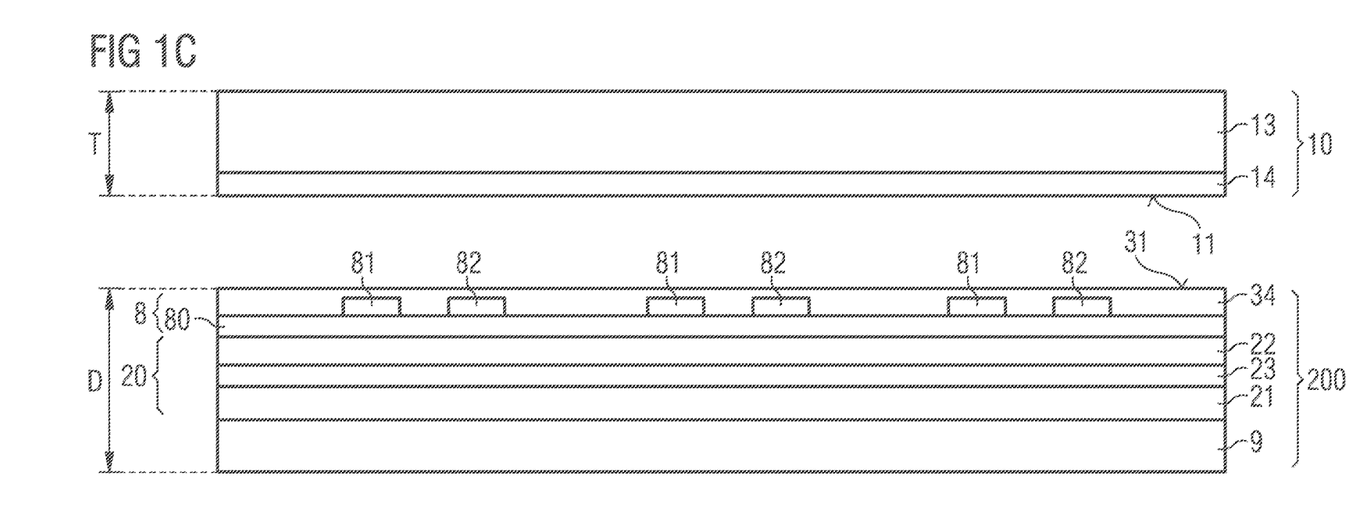

According to FIG. 1C, a carrier composite 10 having a vertical layer thickness T is provided. The carrier composite 10 contains a base body 13 and an insulation layer 14 arranged on the base body 13. In particular, the insulation layer 14 is an electrically-insulating oxide layer, such as an $SiO_2$-layer. The insulation layer 14 can be deposited onto the base body 13 by means of a deposition method. In case that the base body 13 is made of silicon and the insulation layer 14 is a $SiO_2$-layer, the insulation layer 14 can be produced by means of oxidation of the base body 13 or by an $SiO_2$-coating. In contrast to FIG. 1C, however, the insulation layer 14 may be optional.

The carrier composite 10 comprises a connecting surface 11 formed by a surface of the insulation layer 14. In particular, the connecting surface 11 is planarized. The planar connecting surface 11 may have the same or a similar roughness as the planar contact surface 31 of the wafer composite 200. The planar connecting surface 11 can be configured, in analogy to the planar contact surface 31, by a chemical and/or mechanical planarization method. If the carrier composite 10 is free of an insulation layer 114, the connecting layer 11 can be formed by a surface of the base body 13.

Figure 1D:
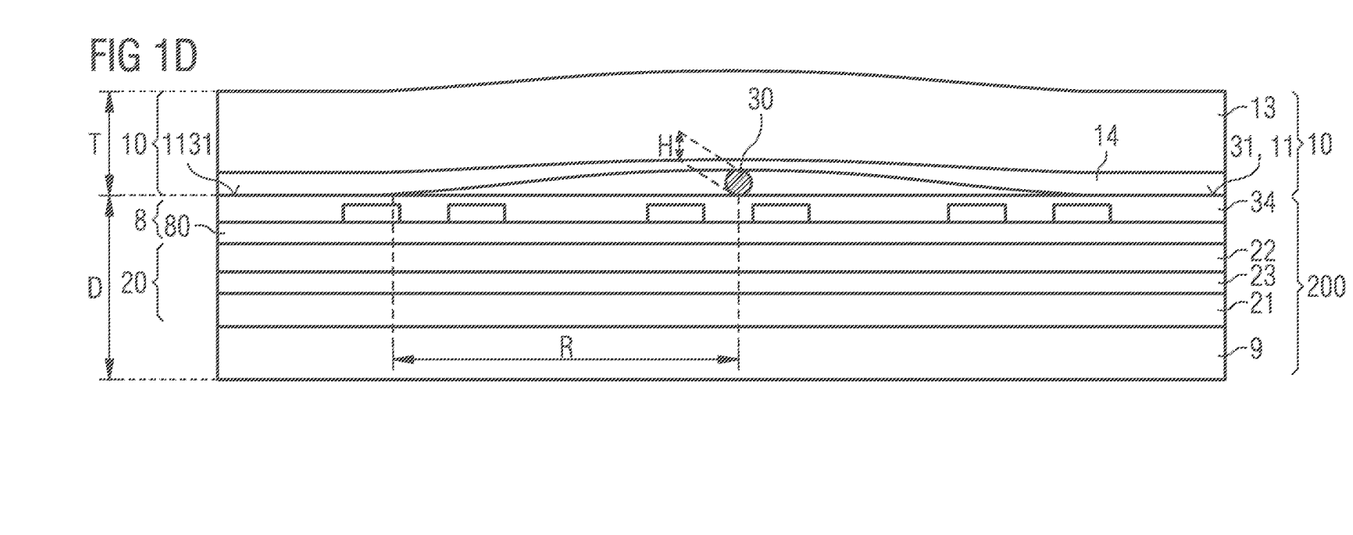

According to FIG. 1D, the wafer composite 200 is mechanically connected to the carrier composite 10 in order to form a composite, in that the planar contact surface 31 and the planar connecting surface 11 are joined in order to form a joint boundary surface 1131. Due to the planar surfaces of particularly low roughness, the wafer composite 200 and the carrier composite 10 can be mechanically connected to one another on the planar surfaces without using a connecting material, such as a bonding agent, and exclusively due to the Van-der-Waals-interactions and/or hydrogen bridge connections between the atoms. The mechanical connection between the wafer composite 200 and the carrier composite 10 can be additionally strengthened in a subsequent method step, for example, by a thermal treatment of preferably approximately 200° C. for producing covalent bonds.

In FIG. 1D, the joint boundary surface 1131 is formed by directly adjoining regions of the connecting surface 11 and the contact surface 31. The joint boundary surface 1131 thus constitutes a physical contact zone between the wafer composite 200 and the carrier composite 10. FIG. 1D shows a defect surface having a lateral radius R, with the defect surface being enclosed in lateral directions by the joint boundary surface 1131. Thus, the defect surface is formed by directly and indirectly adjoining and overlapping regions of the connecting surface 11 and the contact surface 31. Therefore, the planar connecting surface 11 and the planar contact surface 31 are not directly adjoining one another.

The defect surface is to be traced back in particular to impurities, for example, foreign particles between the wafer composite 200 and the carrier composite 10, or to comparatively over-sized local roughness on the planar contact surface 31 and/or the planar connecting surface 11. In FIG. 1D, a vertical height of such an imperfection 30, for example, of the local roughness or the foreign particle, is indicated with H. Such an imperfection 30 can lead to large-area failures of components, since the mechanical connection between the wafer composite 200 and the carrier composite 10 is not sufficiently ensured in the direct vicinity of such an imperfection 30, i.e., on the defect surface.

Figure 1E:
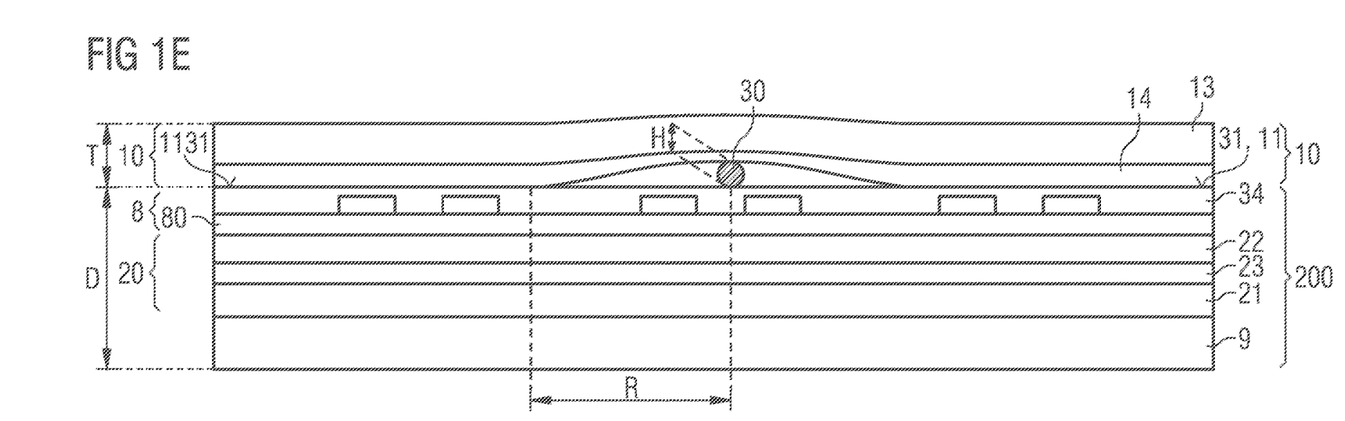

It has been found that the lateral radius R of the defect surface depends on the vertical height H of imperfection 30, the vertical layer thickness T of the carrier composite 10, vertical layer thickness D of the wafer composite 200 as well as on the material quality of the carrier composite 10 as well as of the wafer composite 200, inter alia. In order to reduce the size of the defect surface, the carrier composite 10 is thinned after connection with the wafer carrier 200 and prior to the thermal treatment, for example, as shown in FIG. 1E. Preferably, the base body 13 is thinned to a target thickness in the component to be produced, for example, a layer thickness of approx. 100 µm or 120 µm. In particular, the carrier composite 10 may be thinned in such a way that the vertical layer thickness of the carrier composite 10 and/or of the base body 13 is reduced by at least 50% of its original value. In particular, the vertical layer thickness of the carrier composite 10 and/or the base body 13 is between including 50% and 5%, for example, between 50% and 10% or between including 50% and 30% of its original value.

Reducing the vertical layer thickness T of the carrier composite 10 is thus effected prior to the thermal treatment and prior to the separation of the substrate 9 from the wafer composite 200. The reduction of the vertical layer thickness T leads to a reduced size of the potential defect surfaces, for example, by a local enlargement of the joint boundary surface 1131. This leads to an improved mechanical connection between the wafer composite 200 and the carrier composite 10.

Figure 1F:
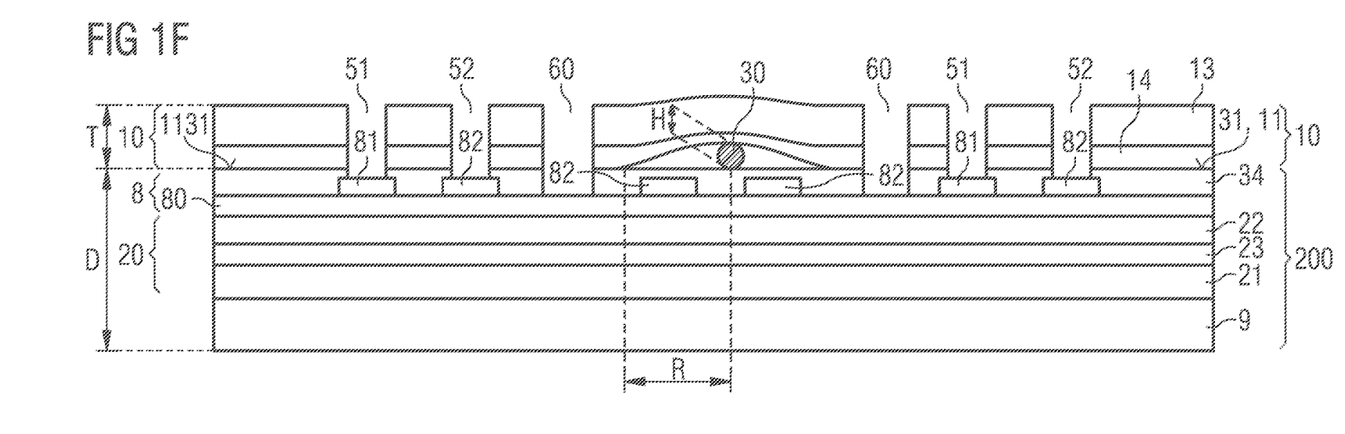

According to FIG. 1F, recesses 51, 52 and 60 are generated through the base body 13. Due to the removal of material inner mechanical stress within the composite are reduced gradually and the defect is locally separated, whereby the defect surface is further reduced in size in the vicinity of the imperfection 30. Here, the recesses can be first openings 51 and second openings 52 for exposing first contact layers 81 and second contact layers 82, respectively. Furthermore, the recesses can be separating trenches 60 which extend through the base body 13, the connecting layer 14 and the planarization layer 34 to the electrically-conductive layer 80 of the contact structure 8. The composite of the carrier composite 10 and the wafer composite 200 can be singulated into a plurality of components along the separation trenches 60.

The formation of the separating trenches 60 through the semiconductor composite 20 allows reducing the mechanical stress within the composite of carrier composite 10 and wafer composite 200 further, wherein the defect surface decreases further gradually due to the formation of the separating trenches 60. As a result, not-yet bonded regions of the wafer composite 200 can subsequently be brought into contact with the carrier composite 10 so that individual regions, if any, for example, regions that are directly affected by foreign particles, of the wafer composite 200 remain non-bonded.

The recesses 51, 52 and 60 can be produced by means of an etching method, preferably by means of a Bosch process, for example, by means of deep reactive ion etching (DRIE). A mask can be applied to the surface of the carrier composite 10 facing away from the wafer composite 200, the mask defining the position of the openings 51 and 52 and/or of the separating trenches 60. The mask can be prefabricated and applied to the carrier composite 10. It is also possible for the mask to be formed on the carrier composite 10 by means of a photo-technique using photo-structurable material.

Figure 1G:
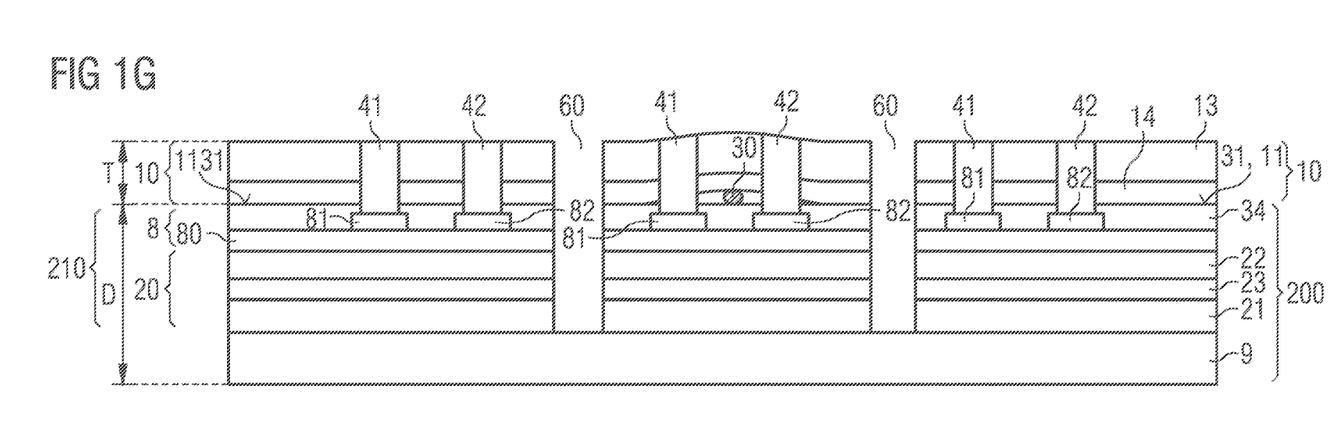

The first openings 51 and the second openings 52 can be filled with an electrically-conductive material for forming a plurality of through-connections 41 and 42 (see FIG. 1G). Thus, alignment is not required in view of the electrical contacting since the through-connections 41 and 42 are produced even after connecting the carrier composite 10 with the wafer composite 200.

In order to form a permanent mechanically-stable connection between the wafer composite 200 and the carrier composite 10, the composite is subjected to a thermal treatment after the reduction of inner mechanical stress. A thermal treatment of about 200° C. is used to produce covalent bonds. Thermal treatment of the composite is effected together with the substrate 9, in particular.

The method step illustrated in FIG. 1G essentially corresponds to the method step illustrated in FIG. 1F. In contrast, the separating trenches 60 can be configured in such a way that the trenches extend through the contact structure 8 and the semiconductor body composite 20, whereby a plurality of components to be produced are defined by the formation of the separating trenches 60. The respective component 100 to be produced may comprise a main body 210 on the substrate 9. The main bodies 210 of various components 100 are physically spaced apart from one another in a lateral direction by means of the separating trenches 60. The optional thermal treatment is preferably effected after the reduction of inner mechanical stress within the composite is completed.

In further contrast to FIG. 1F, FIG. 1G illustrates a plurality of first through-connections 41 and a plurality of second through-connections 42. The separating trenches 60 are configured in such a way that the main bodies 210 each comprise at least one first through-connection 41 and at least one second through-connection 42.

Figure 1H:
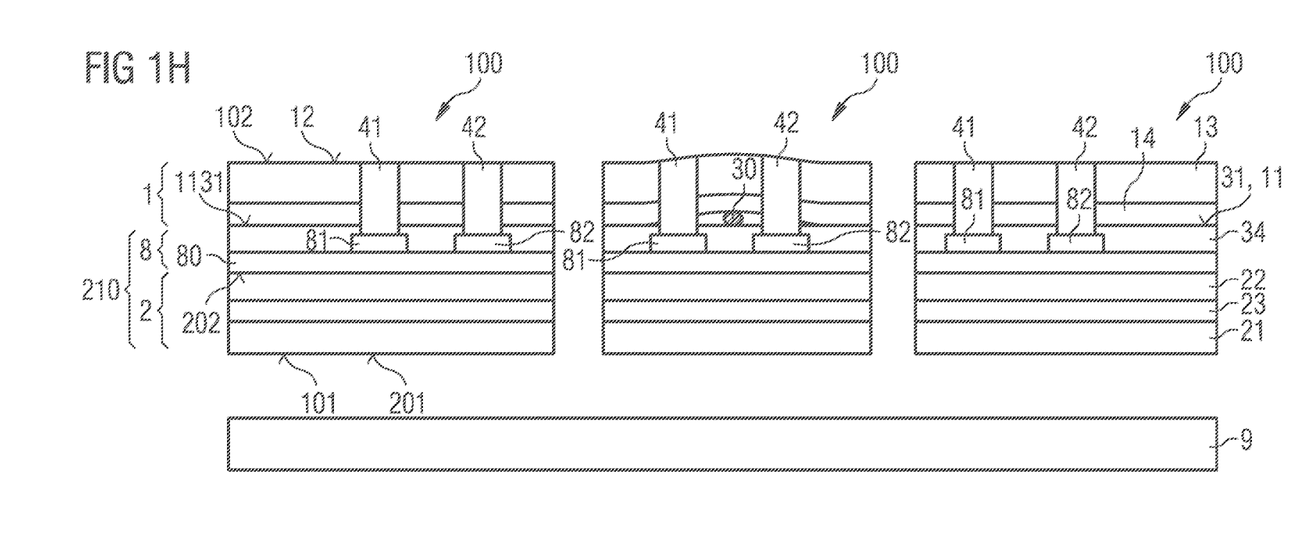

According to FIG. 1H, substrate 9 is removed from the semiconductor body composite 20 or from the main bodies 210, respectively, for example, by means of a mechanical and/or chemical method and/or by means of a laser lift-off method. Thus, the composite of carrier composite 10 and wafer composite 200 is singulated into a plurality of components 100 in such a way that the components 100 each comprise one semiconductor body 2 as part of the semiconductor body composite 20 and one carrier 1 as part of the carrier composite 10.

The component 100 comprises a radiation passage surface 101, which formed by the first main surface 201 of the semiconductor body 2, for example. In contrast to FIG. 1H, the radiation passage surface 101 of the component can be structured. Structuring the radiation passage surface 101 can take place before, during or after separating the substrate 9 from the semiconductor body composite 20. The component 100 comprises a rear side 102 facing away from the radiation passage surface 101. In particular, the rear side 102 of component 100 is formed by a rear side 12 of the carrier 1. The component 100 can preferably be electrically contacted by the rear side 12 of the carrier 1 or the rear side 102 of component 100 by means of through-connections 41 and 42.

Prior to the separation of substrate 9, an auxiliary carrier (not shown in FIG. 1 H), for example, in the form of a foil, can be applied onto the composite, so that the composite of wafer composite 200 and carrier composite 10 is arranged between substrate 9 and the auxiliary carrier. After the separation of the substrate 9 from the composite, the singulated components 100 are thus located on the auxiliary carrier in an orderly manner and can thus be further processed in a simplified manner.

Figure 2A:
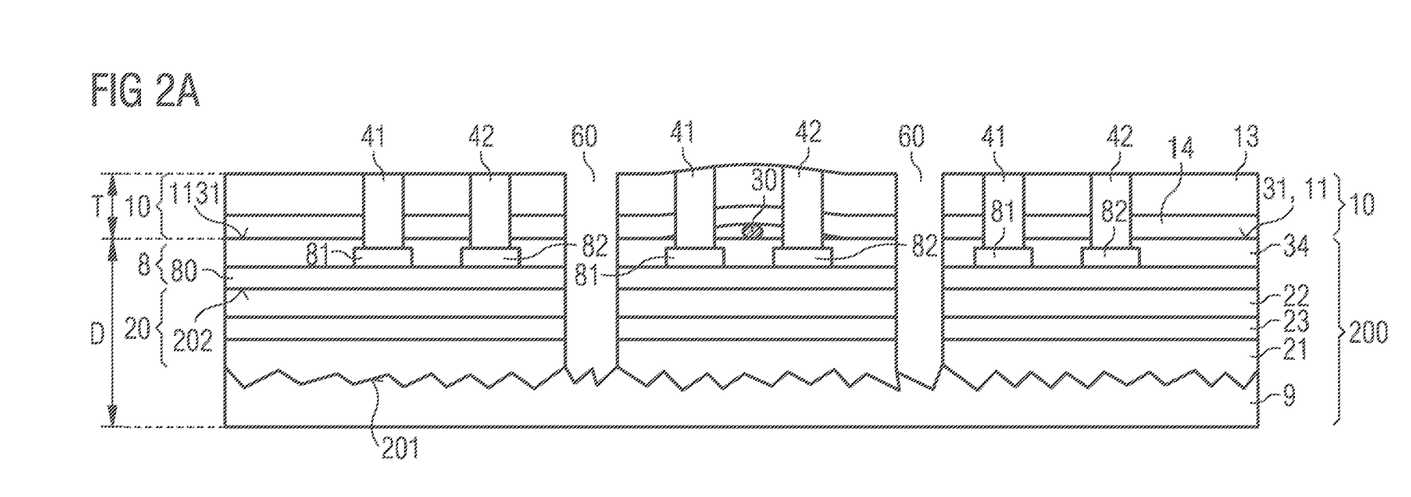
FIGS. 2A to 2B show schematic sectional views of several stages of the method of a further exemplary embodiment for producing a plurality of components.

The exemplary embodiment illustrated in FIG. 2A for a method for producing a plurality of components essentially corresponds to the exemplary embodiment illustrated in FIG. 1G. In contrast, the substrate 9 has a structured surface facing the semiconductor body composite 20. The semiconductor body composite 20 is attached to the substrate 9 having the structured surface, so that the semiconductor body composite 20 also has a structured, first main surface 201 facing the substrate 9.

Figure 2B:
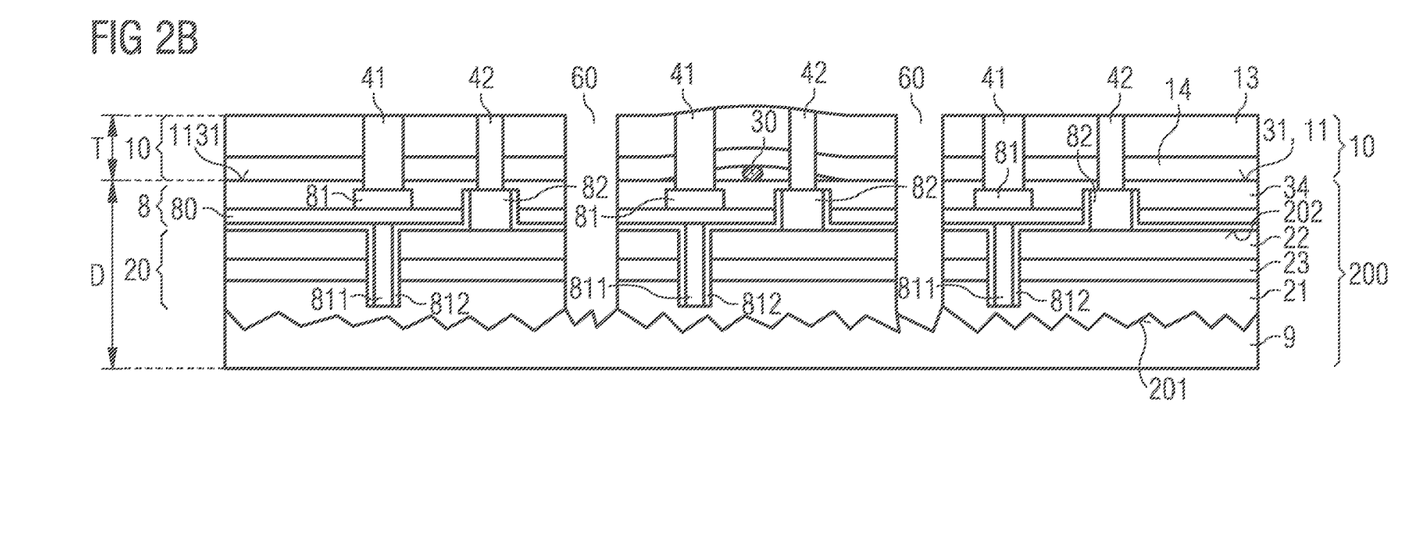

The exemplary embodiment illustrated in FIG. 2B for a method for producing a plurality of components substantially corresponds the exemplary embodiment illustrated in FIG. 2A. In contrast, the contact structure 8 is illustrated in slightly more detail.

The contact structure 8 comprises an insulating structure 812, which electrically insulates the first contact layer 81 from the second contact layer 82. The contact structure 8 further comprises a through-connection 811 extending in the vertical direction, for example, from the second main surface 202 of the semiconductor body composite 20 into the first semiconductor layer 21 through the second semiconductor layer 22 and the active layer 23. In FIG. 2B, through-connection 811 is electrically-conductively connected to the first through-connection 41 via the first contact layer 81. Here, the electrically-conductive layer 80 is electrically-conductively connected to the first contact layer 81 as well as to the through-connection 811 as a result, wherein the electrically-conductive layer 80 is electrically insulated from the second contact layer 82 and the second through-connection 42 by the insulating structure 812. The insulating structure 812 is arranged in places in the semiconductor body composite 200, wherein the through-connection 811 is electrically insulated on all sides by the second semiconductor layer 22 and the active layer 23. In contrast to FIG. 2B, the electrically-conductive layer 80 can be electrically-conductively connected with the second through-connection 42 and electrically-insulated from the first through-connection 41.

Figure 3A:
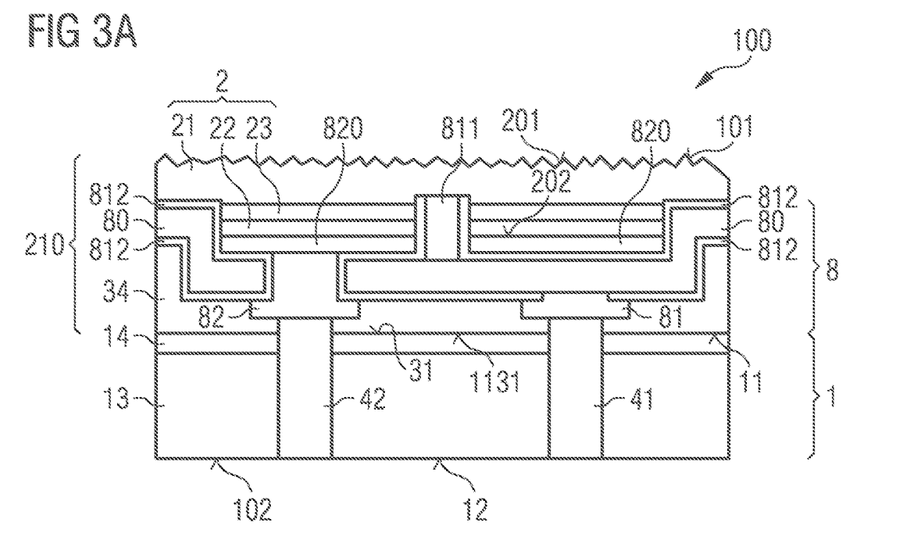
FIGS. 3A and 3B show exemplary embodiments of a component in schematic sectional views.

FIG. 3a schematically illustrates a component 100 which can in particular be produced by the method described herein.

The component 100 comprises a carrier 1 and a main body 210 arranged on the carrier 1. The carrier 1 and the main body 210 comprise a joint boundary surface 1131. The semiconductor body 210 comprises a semiconductor body 2 with an active layer 23 configured for generation or detection of radiation. The main body 210 further contains a contact structure 8 comprising a through-connection 811, an insulating structure 812, an electrically-conductive layer 80 and contact layers 81 and 82. The main body 210 further comprises an electrically-insulating planarization layer 34 facing the carrier 1, in particular having a planar contact surface 31.

The carrier 1 comprises a base body 13 and an insulation layer 14 arranged on the base body 13 and facing the main body 210 in particular having a planar connecting surface 11. The joint boundary surface 1131 has planar design and is arranged between the main body 210 and the carrier 1, wherein the joint boundary surface 1131 is formed by directly-adjoining regions of the connecting surface 11 and the contact surface 31. In particular, the boundary surface 1131 is free of a connecting material. The boundary surface 1131 particularly has a planar design. The carrier 1 is mechanically connected to the main body 210 by means of a direct bonding method, for example.

The component 100 comprises a structured radiation passage surface 101. The component 100 further comprises a rear side 102 facing away from the radiation passage surface 101, which is formed by a rear side 12 of the carrier 1, for example. The component 100 can be electrically contacted via the rear side 102 thereof. The component 100 comprises a first through-connection 41 and a second through connection 42, wherein, in particular, through-connections 41 and 42 are formed one-piece in each case. Through-connections 41 and 42 are configured to be monolithic and do not comprise any sub-regions arranged on top of one another and connected mechanically to one another, for example. In the vertical direction, the first through-connection 41 and/or the second through-connection 42 extends from the rear side 12 of the carrier 1 through the base body 13 as well as the planarization layer 34 to the first contact layer 81 or the second contact layer 82, respectively. The through connections 41 and 42 may protrude from the boundary surface 1131.

The component 100 illustrated in FIG. 3A further comprises a current spreading layer 820 between the semiconductor body 2 and the contact layers 81 and 82. The second contact layer 82 extends through the electrically-conductive layer 80 for electrically contacting the current spreading layer 820.

Figure 3B:
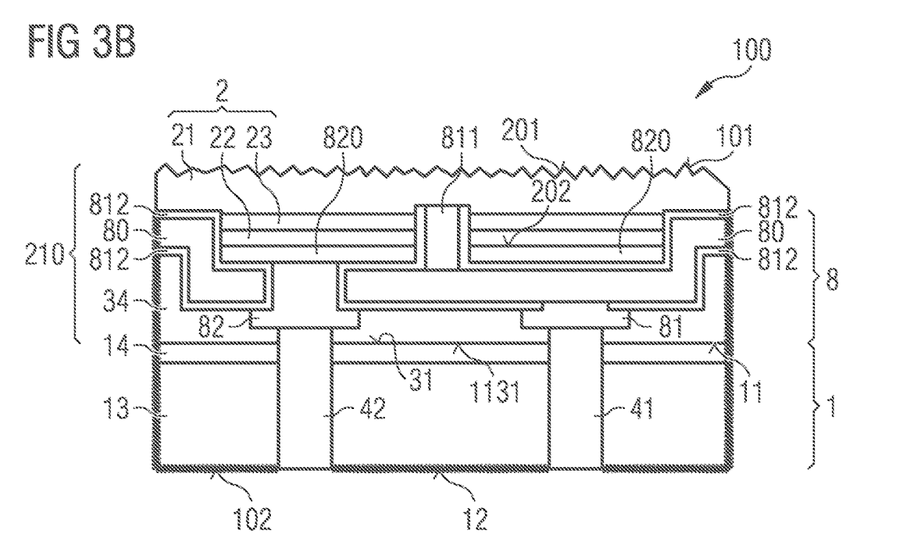

The exemplary embodiment for a component 100 shown in FIG. 3B essentially corresponds to the component 100 illustrated in FIG. 3A. In contrast, component 100 bears singulation traces on the lateral surfaces thereof. In particular, the singulation traces are characteristic traces of an etching method and/or a mechanical method. According to FIG. 3B, traces of mechanical processing on the rear side 102 of the component are illustrated. In particular, the carrier 1 comprises a rear side 12 facing away from the connecting surface 11, which is formed by a surface of the base body 13 and presents traces of mechanical processing. Such traces of mechanical processing can be characteristic traces of a mechanical method for reducing the layer thickness of the carrier 1 or the base body 13, respectively.

In contrast to FIGS. 1A to 3B, it is possible for the planarization layer 34 to be designed as a hybrid layer, comprising one or a plurality of electrically-conductive sub-regions and one or a plurality of electrically-insulating sub-regions. The conductive sub-regions of the planarization layer 34 are formed by the contact layers 81 and 82 of the contact structure 8, for example. In order to form a planar contact surface 31, the planarization layer 34 can be polished in such a way that contact layers 81 and 82 are exposed thereby. Thus, the planar contact surface 31 is completely or at least in places formed by a surface of the planarization layer 34 configured as a hybrid layer.

Instead of the insulation layer 14, the carrier composite 10 may comprise a connecting layer 14 as a hybrid layer, which comprises one or a plurality of electrically-conductive sub-regions and one or a plurality of electrically-insulating sub-regions. The planar connecting surface 11 can thus, at least in places or completely, be formed by a surface of the connecting layer 14 configured as a hybrid layer. The electrically-conductive sub-regions of the planarization layer 34 and the connecting layer 14 may be in direct electric contact with one another on the joint boundary surface 1131 after connecting the wafer composite 200 to the carrier composite 10. The formation of the first openings 51 and/or the second opening 52, for example, shown in FIG. 1F, can be greatly simplified or completely avoided. It is also possible for the base body 13 of the carrier 1 or of the carrier composite 10, respectively, to be designed as a hybrid layer as well. In particular, the entire carrier composite 10 can be configured as a joint hybrid layer with the base body 13 and the connecting layer 14, for example.

The component 100 with the pair of hybrid layers, for example, of the connecting layer 14 and the planarization layer 34, may comprise electrically-conductive sub-regions assigned to the pair of hybrid layers and which are in direct electrical contact to one another on the joint boundary surface 1131, in particular without an intermediate layer. In this case, the first through-connection 41 and the second through-connection 42 may each comprise one electrically-conductive sub-region of the connecting layer 14 and one electrically-conductive sub-region of the planarization layer 34. The sub-region of the planarization layer 34 can be the first contact layer 81 or the second contact layer 82.

In contrast to the illustration of FIGS. 1G and 1H, through-connections 41 and 42 are not produced by filling the first openings 51 and the second openings 52, but by joining electrically-conductive sub-regions of the hybrid layer pair. Along the vertical direction, the first through-connection 41 and/or the second through-connection 42 may have a kink or a crack precisely on the joint boundary surface 1131 which is to be traced back to the adjustment or the different cross-sections of the electrically-conducting sub-regions of through-connection 41 or 42. Such a kink or crack can be discerned in FIGS. 3A and 3B only in a transition between the through-connection 41 or 42 and the contact layer 81 or 82, for example, within the planarization layer 34, and is not located precisely at the joint boundary surface 1131 between the connecting layer 14 and the planarization layer 34, as it is the case with a hybrid layer pair.

By reducing, in particular by gradually reducing the inner mechanical stress in a system of a wafer composite and a carrier composite, wherein the wafer composite and the carrier composite are mechanically connected to one another by means of a direct bonding method, potential defect surfaces in the system can be gradually reduced, before the system is thermally treated, for example, for producing a permanent mechanically stable connection between the wafer composite and the carrier composite, so that potential large-area failures of components are prevented during the production thereof.

The invention is not limited by the description by means of the exemplary embodiments. The invention rather comprises every new feature as well as any combination of features, particularly including any combination of features in the claims, even if this combination or this feature per se is not explicitly indicated in the claims or the exemplary embodiments.

The invention claimed is:

1. A method for producing a plurality of components, the method comprising:
   providing a carrier composite comprising a base body and a planar connecting surface;
   providing a wafer composite comprising a semiconductor body composite and a planar contact surface;
   connecting the wafer composite to the carrier composite thereby forming a joint composite so that the planar contact surface and the planar connecting surface are joined forming a joint boundary surface;
   reducing an inner mechanical stress in the joint composite so that a material of the carrier composite is removed in places, wherein the joint composite is thermally treated in order to form a permanent mechanically-stable connection between the wafer composite and the carrier composite, wherein reducing the inner stress is effected prior to a thermal treatment and after joining the planar contact surface and the planar connecting surface; and
   singulating the joint composite into a plurality of components.

2. The method according to claim 1,
   wherein the joint composite of the carrier composite and the wafer composite is formed by a direct bonding method,
   wherein the joint boundary surface comprises regions of the connecting surface and the contact surface directly adjoining one another, and
   wherein the joint boundary surface is at least locally enlarged by reducing inner mechanical stress.

3. The method according to claim 1, wherein connecting the wafer composite and the carrier composite is initially effected under normal conditions and the joint composite is thermally-treated in a subsequent method step, and wherein prior to the thermal treatment the joint boundary surface is at least locally enlarged by reducing the inner mechanical stress in the joint composite.

4. The method according to claim 1, wherein a material of the carrier composite is removed such that the carrier composite has a reduced vertical thickness.

5. The method according to claim 1, wherein the material of the carrier composite is removed such that a vertical layer thickness of the base body is reduced by at least 50% of its original value.

6. The method according to claim 1, wherein recesses are formed through the base body for reducing the inner mechanical stress in the joint composite.

7. The method according to claim 1, wherein the base body comprises a semiconductor material.

8. The method according to claim 1, wherein the carrier composite comprises an insulation layer, and wherein the planar connecting surface is formed by a surface of the insulation layer.

9. The method according to claim 8, wherein the base body comprises silicon, and wherein the insulation layer is a silicon oxide layer.

10. The method according to claim 1,
    wherein the wafer composite comprises a planarization layer and contact layers on the semiconductor body composite,
    wherein the contact layers are configured for electrically contacting of the semiconductor body composite,
    wherein the contact layers are enclosed by the planarization layer at least in lateral directions, and
    wherein the planar contact surface is formed by a surface of the planarization layer at least in places.

11. The method according to claim 10, wherein the planarization layer, in a top view of the semiconductor body composite, completely covers the contact layers, and wherein the planar contact surface comprises exclusively the planarization layer.

12. The method according to claim 10, wherein the planarization layer comprises silicon oxide.

13. The method according to claim 10, wherein the contact layers are completely covered by the carrier composite after connecting and openings are formed through the carrier composite for exposing the contact layers.

14. The method according to claim 1, wherein the wafer composite comprises a growth substrate, and wherein the semiconductor body composite is arranged on the growth substrate and the growth substrate is removed from the semiconductor body composite.

15. A method for producing a plurality of components, the method comprising:
    providing a carrier composite comprising a base body and a planar connecting surface;
    providing a wafer composite comprising a semiconductor body composite and a planar contact surface;
    connecting the wafer composite to the carrier composite thereby forming a joint composite such that the planar contact surface and the planar connecting surface are joined thereby forming a joint boundary surface;
    reducing inner mechanical stress in the composite by reducing material of the carrier composite in places; and
    singulating the joint composite into a plurality of components,
    wherein a plurality of separation trenches are formed through the base body after a preliminary connection and prior to a thermal treatment, and wherein, after the thermal treatment, the joint composite is singulated into the plurality of components along the separation trenches such that each component comprises one semiconductor body as a part of the semiconductor body composite and one carrier as a part of the carrier composite.

16. The method according to claim 15, wherein the wafer composite comprises a planarization layer, the planarization layer being a hybrid layer with one or a plurality of electrically-conductive sub-regions and one or a plurality of electrically-insulating sub-regions, and wherein the planar contact surface is formed at least in places by a surface of the planarization layer configured as a hybrid layer.

17. The method according to claim 16, wherein the carrier composite comprises a connecting layer as a hybrid layer, which comprises one or a plurality of electrically-conductive sub-regions and one or a plurality of electrically-insulating sub-regions, wherein the planar connecting surface is formed at least in places by a surface of the connecting layer configured as a hybrid layer, and wherein the electrically-conductive sub-regions of the planarization layer and of the connecting layer are in direct electrical contact with the carrier composite at the joint boundary surface immediately after connecting the wafer composite.

18. A component comprising:
a carrier; and
a main body arranged on the carrier, the main body comprising:
   a semiconductor body with an active layer configured for generating radiation or detecting radiation; and
   an electrically-insulating planarization layer facing the carrier and having a planar contact surface; and
the carrier comprising:
   a base body formed of silicon; and
   an insulation layer facing the main body, being arranged on the base body and having a planar connecting surface,
wherein the component comprises a planar boundary surface between the main body and the carrier,
wherein the planar boundary surface is formed by regions of the planar connecting surface and the planar contact surface immediately adjoining one another,
wherein the planar boundary surface is free of a connecting material,
wherein the carrier has a rear side facing away from the connecting surface, which is formed by a surface of the base body and bears traces of mechanical processing,
wherein the main body comprises a contact structure configured for electrically contacting of the semiconductor body, which is arranged between the semiconductor body and the carrier,
wherein the component comprises at least one electrically-conductive through-connection which extends from the rear side of the carrier through the base body to the contact structure, and
wherein the at least on through-connection is formed one-piece and protrudes from the boundary surface in a vertical direction.

19. The component according to claim 18, wherein the insulation layer is a silicon oxide layer.

* * * * *